United States Patent
Korenaga

(10) Patent No.: US 6,426,788 B1
(45) Date of Patent: *Jul. 30, 2002

(54) STAGE DEVICE AND EXPOSURE APPARATUS USING THE SAME

(75) Inventor: Nobushige Korenaga, Utsunomiya (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/667,240

(22) Filed: Sep. 21, 2000

Related U.S. Application Data

(63) Continuation of application No. 08/901,792, filed on Jul. 28, 1997, now Pat. No. 6,177,978, which is a continuation of application No. 08/441,696, filed on May 15, 1995, now abandoned.

(30) Foreign Application Priority Data

May 19, 1994 (JP) .............................................. 6-129785
May 15, 1995 (JP) .............................................. 7-134744

(51) Int. Cl.$^7$ ...................... G03B 27/42; G03B 27/58; G03B 27/62
(52) U.S. Cl. ............................ 355/53; 355/72; 355/75
(58) Field of Search ............................ 355/53, 72–76; 310/10, 12; 375/34; 318/611, 649

(56) References Cited

U.S. PATENT DOCUMENTS

| 4,675,582 A | 6/1987 | Hommes et al. ............... 318/38 |
| 4,764,815 A | 8/1988 | Landsman ................... 358/293 |
| 4,854,444 A | 8/1989 | Iwamoto ..................... 198/750 |
| 4,993,696 A | 2/1991 | Furukawa et al. ............. 269/73 |
| 5,172,160 A | 12/1992 | Van Eijk et al. ............... 355/53 |
| 5,260,580 A | 11/1993 | Itoh et al. ................. 250/492.2 |
| 5,446,519 A | 8/1995 | Makinouchi .................. 355/53 |
| 5,465,827 A | 11/1995 | Nakagawa et al. ...... 198/465.3 |
| 5,477,304 A | 12/1995 | Nishi ........................... 355/53 |
| 5,610,686 A | 3/1997 | Osanai ........................ 355/72 |
| 5,796,469 A | 8/1998 | Ebinuma ...................... 355/53 |
| 5,844,666 A | 12/1998 | Van Engelen et al. ........ 355/72 |
| 6,175,404 B1 * | 1/2001 | Lee ............................. 355/53 |
| 6,177,978 B1 * | 1/2001 | Korenaga ..................... 355/53 |

FOREIGN PATENT DOCUMENTS

| DE | 4123323 | 1/1993 |
| EP | 0 206 804 | 12/1986 |
| WO | 93/09467 | 5/1993 |

* cited by examiner

Primary Examiner—Russell Adams
Assistant Examiner—Hung Henry Nguyen
(74) Attorney, Agent, or Firm—Fitzpatrick, Cella, Harper & Scinto

(57) ABSTRACT

A scanning exposure apparatus includes a projection optical system for projecting a pattern of a reticle onto a wafer, a reticle stage for holding and scanningly moving the reticle relative to the projection optical system, a reticle stage actuator for moving the reticle stage and a reticle interferometer for detecting positional information related to the reticle stage, the reticle interferometer being kept separate from the reticle stage actuator with respect to vibration transmission.

106 Claims, 17 Drawing Sheets

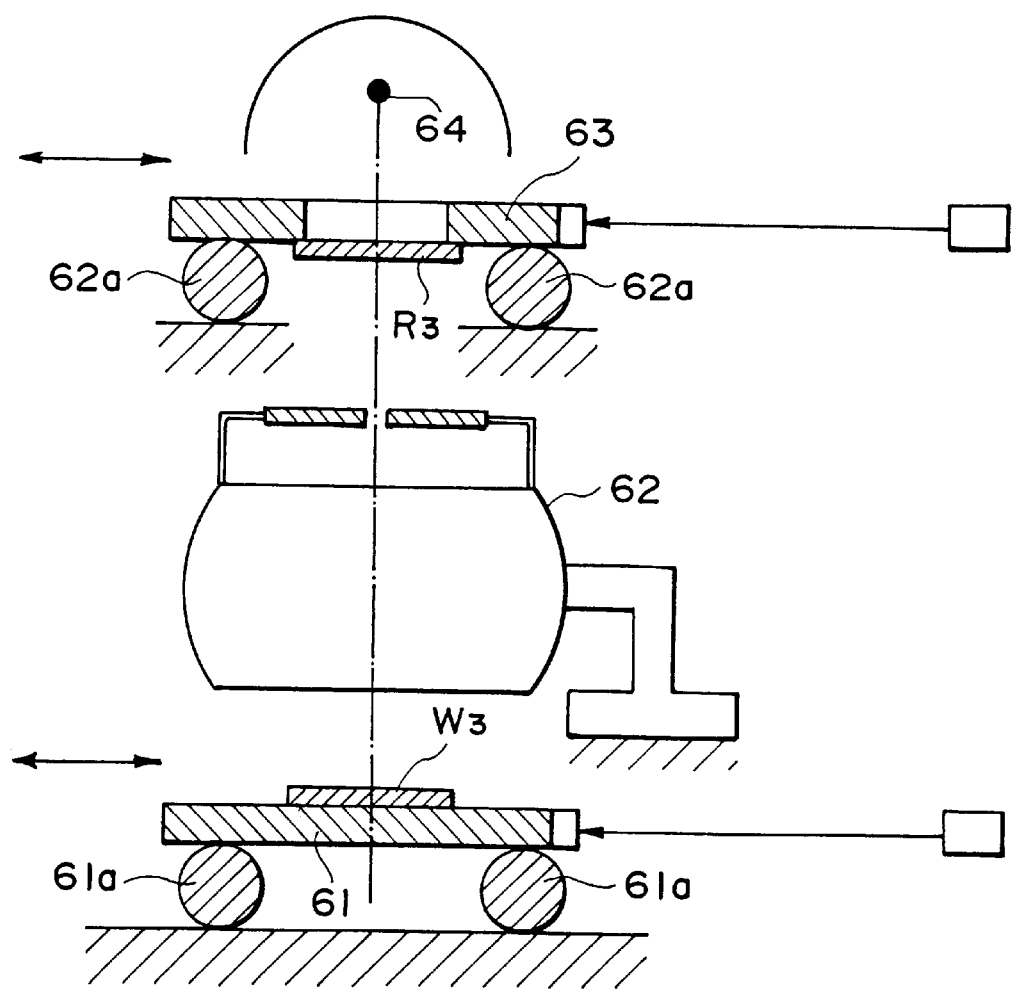
F I G. 6

STAGE DEVICE AND EXPOSURE APPARATUS USING THE SAME

This application is a continuation of Application Ser. No. 08/901,792, filed Jul. 28, 1997 now U.S. Pat. No. 6,177,978, which is a contiunation of Ser. No. 08/441,696 filed May 15, 1995 now abandoned.

FIELD OF THE INVENTION AND RELATED ART

This invention relates generally to an exposure apparatus such as a semiconductor exposure apparatus and, more particularly, to a scanning stage device suitably usable in a scanning type exposure apparatus wherein an arcuate or rectangular slit-like region of a pattern of a reticle is imaged on a substrate such as a wafer and wherein both the reticle and the substrate are scanningly moved so that the reticle pattern as a whole is exposed and transferred to the substrate.

In a scanning type exposure apparatus wherein both a reticle (original) and a substrate are scanningly moved so that a reticle pattern as a whole is transferred onto the substrate, it is necessary to control the scanning speed of the reticle or the substrate very precisely and stably. Generally, for this purpose, a scanning exposure apparatus is provided with linear motor means which is, as shown in FIG. 14, incorporated into driving means of a scanning stage device for holding and scanningly moving a reticle or a substrate. The illustrated device comprises a base 101, a guide 102 fixed to the base 101 and having a U-shaped sectional shape, and a wafer stage 103 movable reciprocally in a predetermined direction (scan direction) along the guide 102. The device further comprises a pair of linear motor stators 104 and 105 disposed at opposite sides of the movement path of the wafer stage 103, which is movable along the guide 102, and being provided integrally with the base 101. The device further comprises a pair of linear motor movable elements 106 and 107 which are provided integrally with the sides 103a and 103b of the wafer stage 103, respectively. The linear motor stators 104 and 105 and the linear motor movable elements 106 and 107 constitute a pair of linear motors $E_1$ and $E_2$ for providing acceleration and deceleration of the wafer stage 103 in the scan direction. The wafer stage 103 is guided by the guide 102 without contact thereto, through association of static pressure bearing means (not shown), for example.

The linear motor stators 104 and 105 have elongated loop-like yokes 104a and 105a, extending along and substantially throughout the length of the guide 102, and elongated magnets 104b and 105b fixed to the insides of the yokes 104a and 105a, respectively. The magnets 104b and 105b extend through coil openings 106a and 107a, respectively, of the linear motor movable elements 106 and 107, respectively. When the linear motor movable elements 106 and 107 are energized in response to supply of drive currents from a voltage source (not shown), thrust forces are produced along the magnets 104b and 105b by which the wafer stage 103 is accelerated or decelerated.

Wafer $W_0$ is attracted to the wafer stage 103 and, above the wafer, a reticle is held by a reticle stage 203 (see FIG. 17). By means of slit-like exposure light $L_0$ (its section being depicted by a broken line) impinging on a portion of the reticle, a slit-like region of the wafer $W_0$ is exposed such that a portion of the reticle pattern is transferred to that region. Each exposure cycle of the scanning type exposure apparatus comprises moving both the wafer stage 103 and the reticle stage 203 so that the reticle pattern as a whole is transferred to the wafer $W_0$. During movement of the wafer stage 103 which holds the wafer $W_0$, the position thereof is detected by means of a laser interferometer 108 (FIG. 17). The reticle stage 203 has similar driving means such as described above, and it is controlled in a similar way. Speed control during acceleration and deceleration of the wafer stage 103 through the linear motors $E_1$ and $E_2$, is performed in the following manner.

FIG. 15 is a top plan view of the scanning stage device of FIG. 14. When, for example, the wafer stage 103 is at the leftward end position in the scan direction as viewed in the drawing and the center $O_0$ of the width of the wafer $W_0$ in the scan direction is at the acceleration start position $P_1$, acceleration by rightward thrust of the linear motors $E_1$ and $E_2$ as viewed in the drawing starts. Acceleration stops when the center $O_0$ of the wafer $W_0$ comes to the acceleration end position $P_2$. After this, the liner motors $E_1$ and $E_2$ serve only to control and maintain a constant scanning speed of the wafer stage 103. When the center $O_0$ of the wafer $W_0$ comes to the deceleration start position $P_3$, deceleration by leftward thrust of the linear motors $E_1$ and $E_2$ as viewed in the drawing starts. When the center $O_0$ of the wafer $W_0$ comes to the deceleration end position $P_4$, running of the wafer stage 103 stops. Simultaneously therewith, leftward acceleration as viewed in the drawing starts. Moving the wafer stage 103 leftwardly, as viewed in the drawing, is performed by controlling the linear motors $E_1$ and $E_2$ in a similar way but in the opposite direction.

In such an acceleration and deceleration cycle, if for example the wafer stage 103 runs rightwardly as viewed in the drawing, the exposure process starts just when the center $O_0$ of the wafer $W_0$ comes to the acceleration end position $P_2$, such that the exposure light $L_0$ impinges on a rightward end slit-like region of the wafer $W_0$ as viewed in the drawing. When the center $O_0$ of the wafer $W_0$ comes to the deceleration start position $P_3$, the exposure of the whole surface of the wafer $W_0$ is completed. Thus, during exposure of the wafer $W_0$, the wafer stage 103 moves at a constant scanning speed, and the reticle (not shown) moves similarly. The relative position of the wafer $W_0$ and the reticle at the time of starting of the exposure process is controlled precisely, and the speed ratio of the wafer $W_0$ and the reticle is controlled so that it exactly corresponds to the reduction magnification of a projection optical system disposed between the wafer and the reticle. After completion of the exposure process, both the wafer and the reticle are decelerated appropriately.

For a higher productivity of a scanning type exposure apparatus, it is desirable to reduce, as much as possible, the time to be consumed by the acceleration and deceleration of the linear motors $E_1$ and $E_2$. Also, from the viewpoint of saving space, the moving distance of the wafer stage 103 during acceleration and deceleration of the linear motors $E_1$ and $E_2$ should desirably be short. This requires that the linear motors $E_1$ and $E_2$ provide a large thrust and also that the strength of the magnetic field of the linear motor stators 104 and 105 is very large, such as about 5,000 G., for example. In order to meet this requirement, the yokes 104a and 105a may be made of a material such as iron, for example, having a high saturation magnetic flux density, but even on such an occasion it is still necessary that the opposite end portions 104c and 105c (FIG. 16) of the yokes 104a and 105a, where the magnetic flux of the magnetic field is strong such as discussed above is concentrated, have a very large sectional area so as not saturate the concentrated magnetic flux.

In the arrangement described above, the opposite end portions of the yokes of the linear motor stators should have a very large sectional area so as to avoid saturation of the magnetic flux. Additionally, the central portion of the yoke (where acceleration or deceleration of a wafer stage, for example, is not necessary) has the same sectional size of the end portion thereof. As a result, the yoke as a whole has a very large weight. Thus, the device as a whole is very large and very heavy. Also, for producing a large magnetic field as described above, the magnet of the linear motor stator should have a large thickness, and it should be made of a rare earth magnet which is very expensive. If a thick and expensive magnet is provided along the entire running path of the scanning stage, the cost of the linear motor becomes very high.

Further, as shown in FIG. 17, as regards the reticle stage 203, it is necessary that a base 201 thereof is supported by a frame 204 which is integral with the base 101 of the wafer stage 103, and additionally that the reticle stage is accelerated to a speed, four or five times higher than the speed of the wafer stage 103. For this reason, there occurs a problem of vibration of the reticle stage 203 due to the reactive force of the -linear motor. More specifically, since the reticle stage 203 is located in an upper portion of the exposure apparatus, structurally a vibration easily occurs. Also, since the reticle stage is driven by a large drive force as compared with that of the linear motor means of the wafer stage 103, the exposure apparatus as a whole is swingingly vibrated to a great degree which causes a large external disturbance to a servo system of the exposure apparatus. Since such an external disturbance is a bar to synchronization of scanning of the reticle stage 203 and the wafer stage 103, it is necessary to delay the start of the succeeding exposure cycle until the external disturbance diminishes. Thus, the throughput is low.

Furthermore, if the exposure apparatus as a whole is swingingly vibrated, it may cause deformation of the frame 204 which supports the reticle stage 203 and the projection optical system 205, which may result in a large error in detected values of the laser interferometers 108 and 208, for example, for detecting the positions of the wafer stage 103 and the reticle stage 203, respectively.

SUMMARY OF THE INVENTION

It is an object of the present invention to provide a solution for at least one of the problems described above.

It is another object of the present invention to provide a stage device by which reduction in size, reduction in weight, reduction in heat generation or reduction of cost is assured.

It is a further object of the present invention to provide an exposure apparatus having such a stage device.

It is a still further object of the present invention to provide a stage device by which vibration due to drive can be reduced considerably.

It is yet a further object of the present invention to provide an exposure apparatus having such a stage device as discussed above.

It is yet a further object of the present invention to provide a device manufacturing method for manufacturing high-precision microdevices by using an exposure apparatus such as described above.

In accordance with an aspect of the present invention, there is provided a stage device, comprising: a movable stage being movable along a path having a constant speed movement region and an acceleration region; first thrust producing means for accelerating and moving said movable stage in said acceleration region of said path; and second thrust producing means, separate from said first thrust producing means, for moving said movable stage at a constant speed in said constant speed movement region of said path.

As compared with the first thrust producing means which provides positive or negative acceleration of the movable stage, the second thrust producing means for moving the movable stage at a constant speed can be made considerably light in weight and small in size. Thus, the driving means portion of the stage device can be small in size, light in weight, low in heat generation and small in cost.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 6 is a schematic view for explaining another embodiment of a scanning type exposure apparatus having a stage device according to one of the first and second embodiments of the present invention.

DESCRIPTION OF THE PREFERRED EMBODIMENTS

Some preferred embodiments of the present invention will be described in conjunction with the drawings.

Embodiment 1

Figure 1:
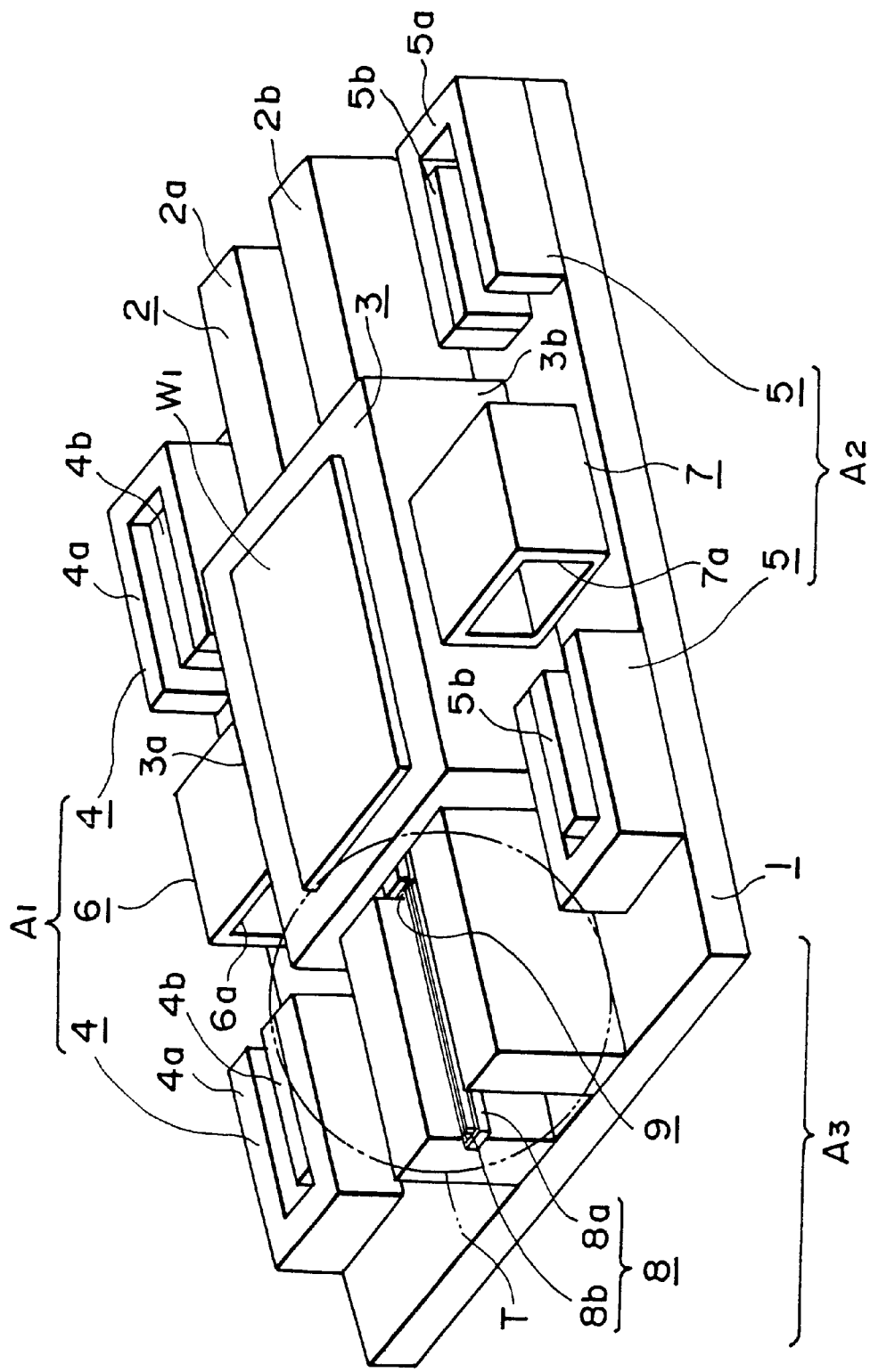
FIG. 1 is a perspective view of a scanning stage device according to a first embodiment of the present invention.

FIG. 1 is a perspective view of a scanning stage device according to a first embodiment of the present invention.

The stage device comprises an anti-vibration base 1, a guide 2 having a pair of guide rails 2a and 2b fixed to the base 1, a scanning stage 3 being reciprocally movable in a predetermined direction along the guide 2, two pairs of linear motor stators 4 and 5 disposed along and at the opposite sides of the running path of the scanning stage 3, and linear motor movable elements 6 and 7 provided at the opposite side faces 3a and 3b of the scanning stage 3 integrally therewith.

Figure 14:
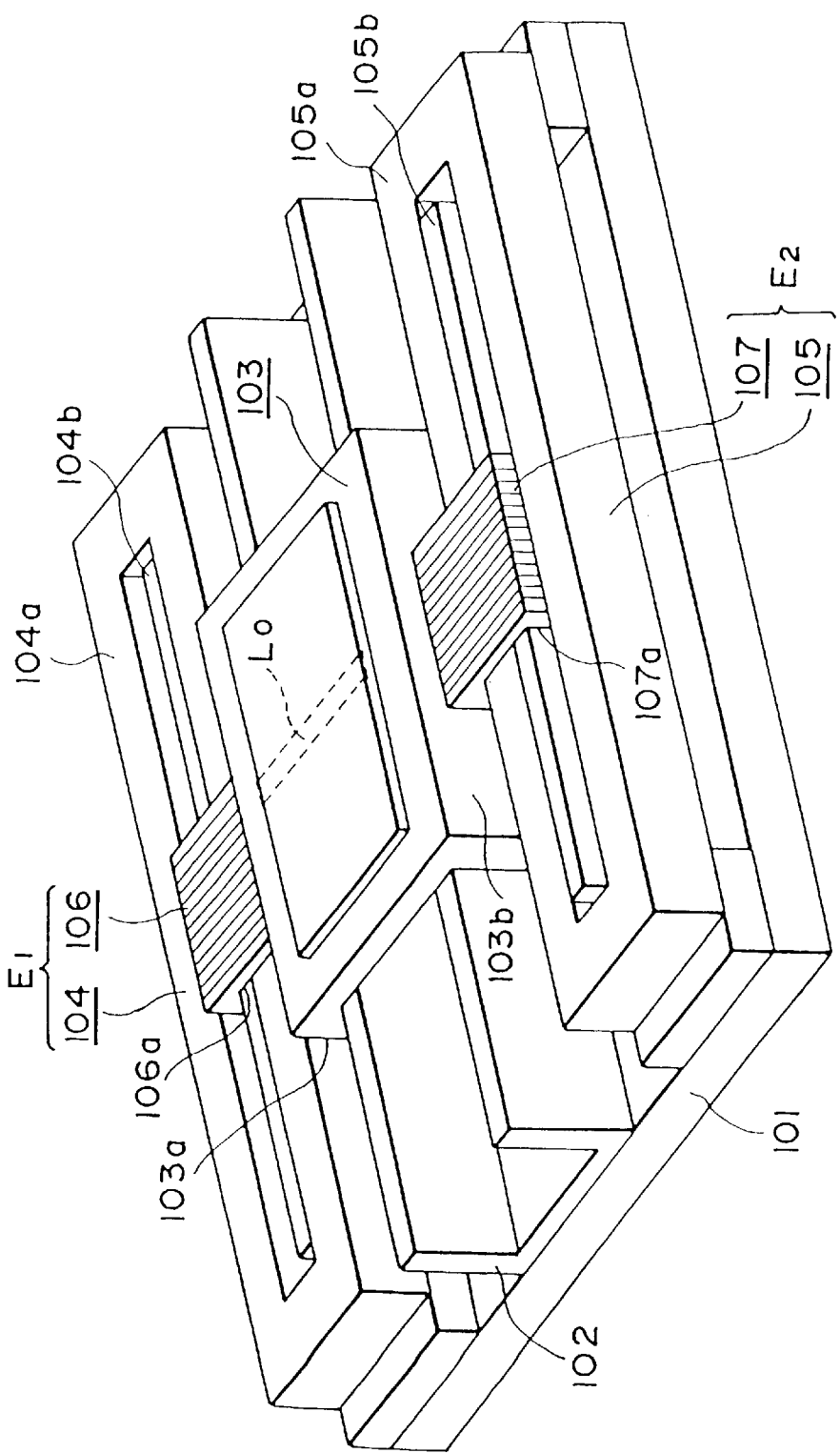
FIG. 14 is a perspective view of a known type scanning stage device.
Figure 15:
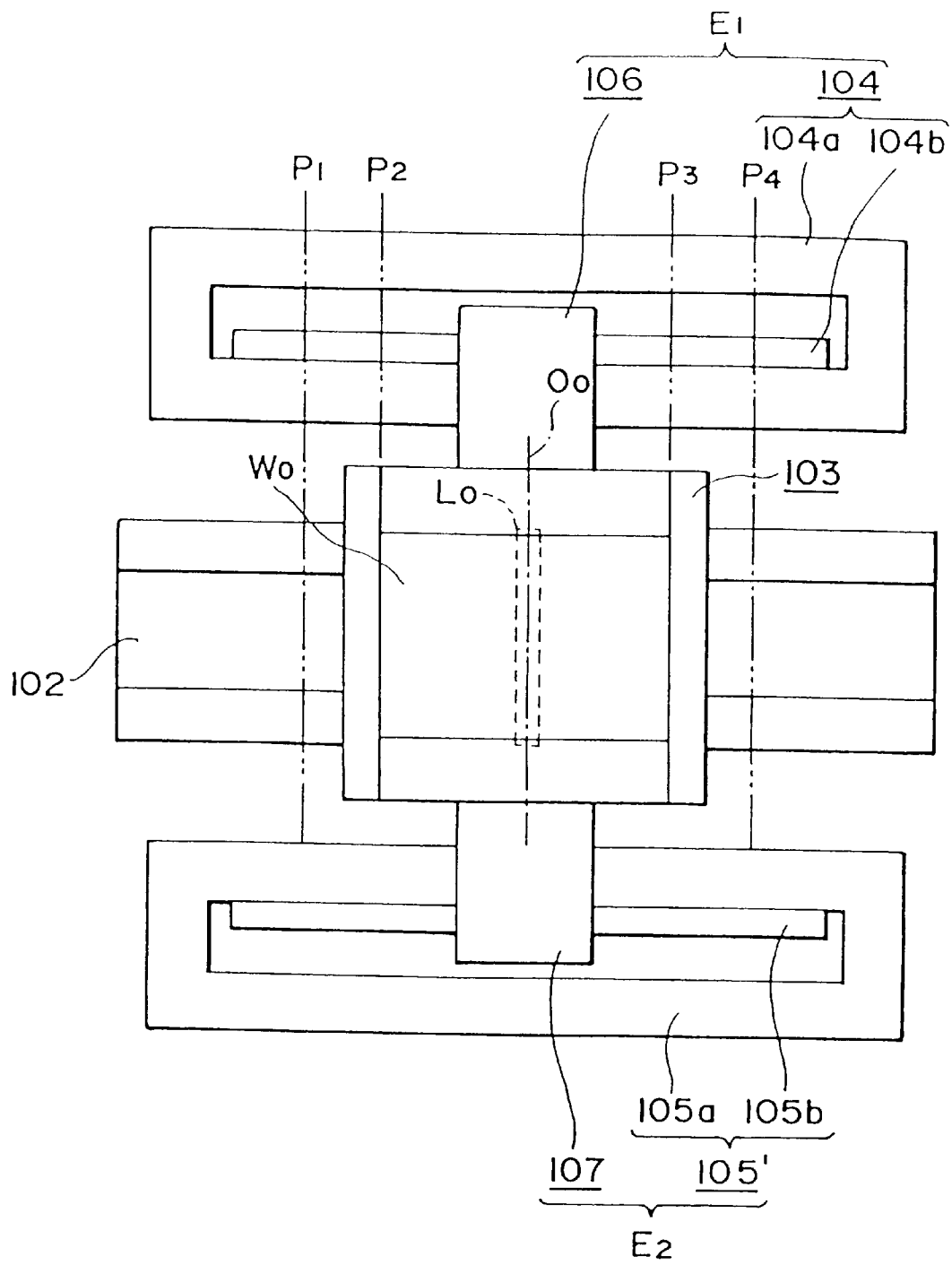
FIG. 15 is a top plan view of the stage device of FIG. 14.
Figure 16:
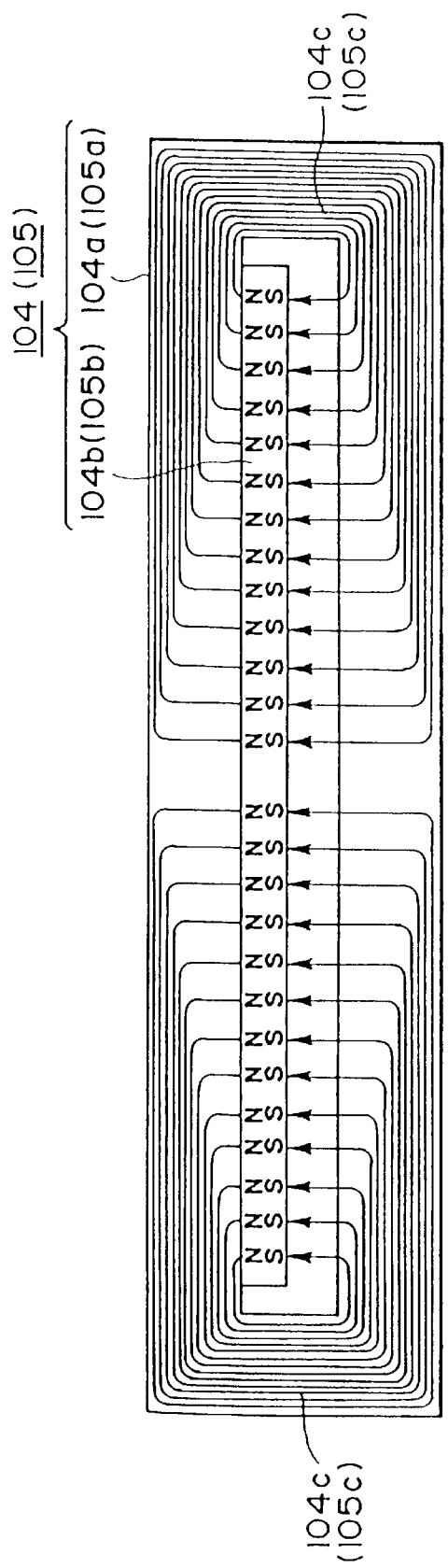
FIG. 16 is a schematic view for explaining a magnetic field of linear motor stators of the stage device of FIG. 14.
Figure 17:
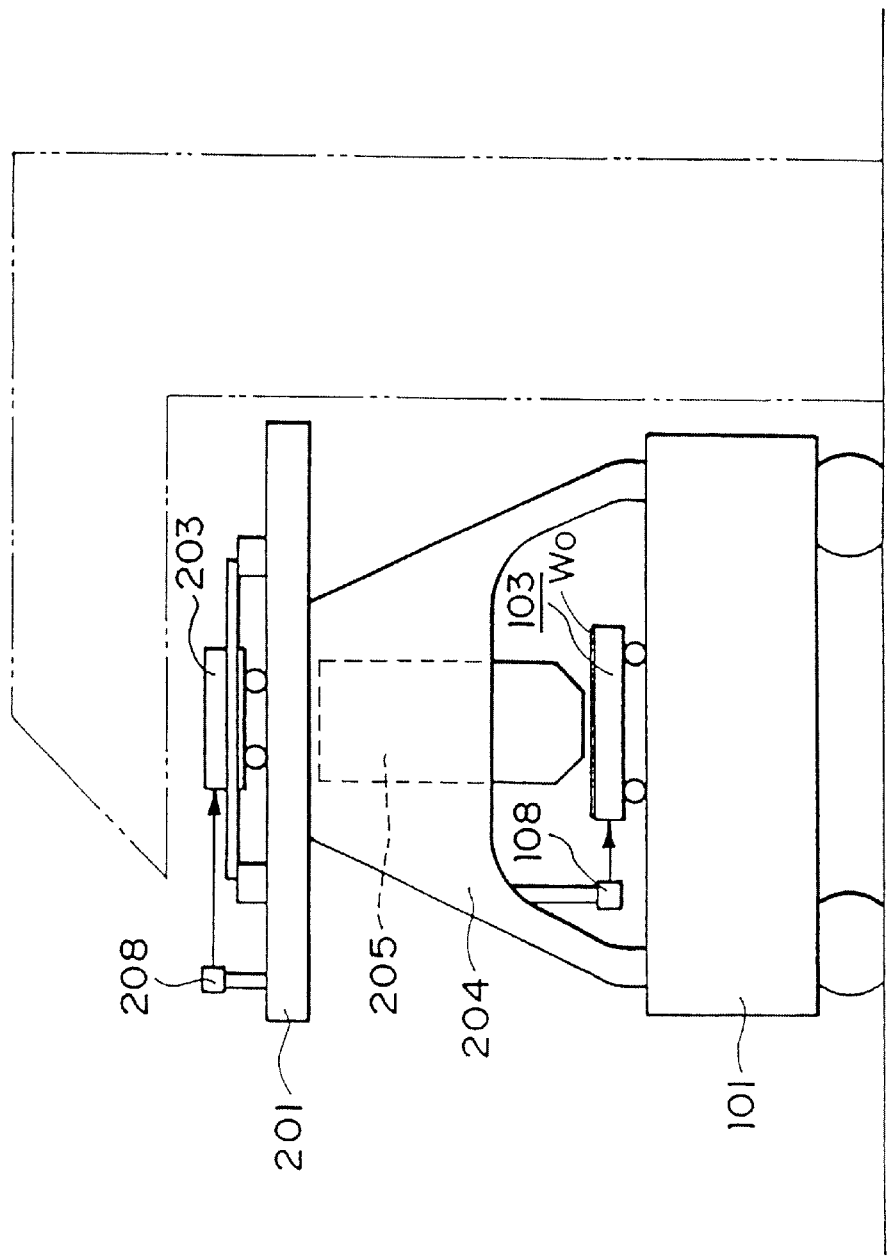
FIG. 17 is an elevational view of a known type exposure apparatus.

Each pair of linear motor stators 4 (5) has a structure which may correspond to the structure that: a long linear motor stator such as illustrated in FIG. 14 is provided along the entire length of the running path of the scanning stage 3, and after this, the central portion thereof is removed such that the opposite end portions of the stator remain. The stators 4 (5) are disposed at those positions corresponding to the positions of the "remaining" stator end portions.

The linear motor stators 4 and 5 cooperate with the linear motor movable elements 6 and 7 being integral with the scanning stage 3, to provide linear motors $A_1$ and $A_2$ (first thrust producing means) which serve to produce a first thrust for accelerating (with positive acceleration) or decelerating (with negative acceleration) the scanning stage 3 in each of the opposite end portions (acceleration or deceleration region) of the running path.

The scanning stage 3 movement is guided by the guide 2 without contact thereto, through static pressure bearing pads (not shown), for example. As the scanning stage 3 moves in the end portion of the running path, portions of yokes 4a and 5a of the linear motor stators 4 and 5 as well as magnets 4b and 5b held thereby penetrate through openings 6a and 7a of the linear motor movable elements 6 and 7, respectively. As the linear motor movable elements 6 and 7 are energized by drive currents supplied thereto, they produce a thrust for accelerating or decelerating the scanning stage 3.

Figure 2:
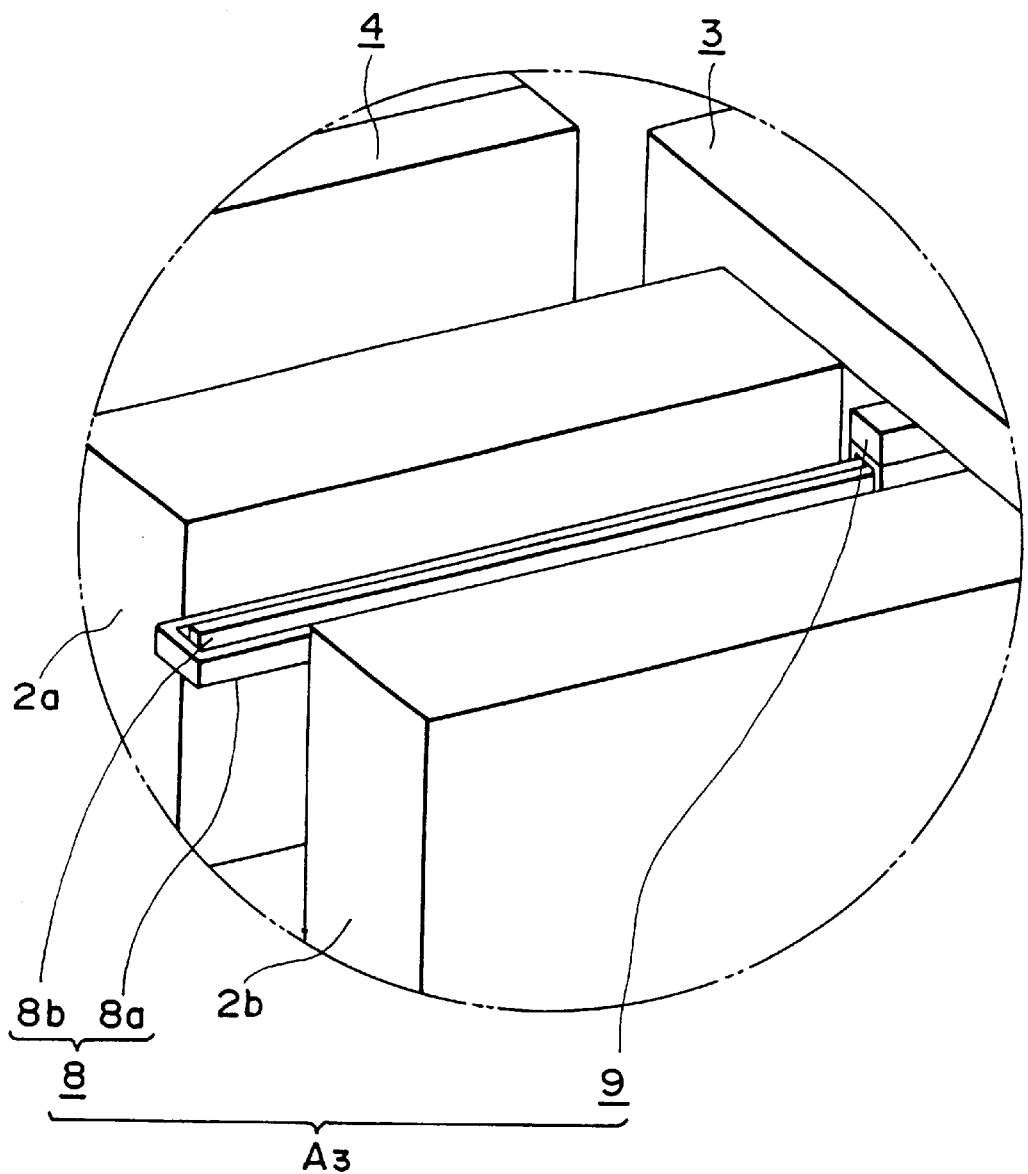
FIG. 2 is a fragmentary enlarged perspective view of a portion of the stage device of FIG. 1, as depicted by a circle T in FIG. 1.

Disposed between the guide rails 2a and 2b of the guide 2 is a secondary linear motor stator 8 which comprises, as shown in an enlarged view of FIG. 2, a small loop-like secondary yoke 8a and a secondary magnet 8b fixed to the inside of the secondary yoke 8a. Also, there is a secondary linear motor movable element 9 which cooperates with the secondary linear motor stator 8 to provide a secondary linear motor $A_3$ (second thrust producing means). The secondary linear motor stator 8 is fixed to the anti-vibration base 1, and the secondary linear motor movable element 9 is fixed to the bottom face of the scanning stage 3.

The secondary linear motor $A_3$ is energized after the scanning stage 3 is accelerated up to a predetermined speed by means of the linear motors $A_1$ and $A_2$, and it serves to produce a second thrust effective to maintain the scanning speed of the scanning stage 3 constant. Thus, the secondary linear motor $A_3$ serves to produce a thrust only in a period in which the scanning stage 3 runs through the central portion (constant speed scanning region) of the running path, to thereby maintain the scanning speed of the scanning stage 3 constant. Therefore, it is not necessary for the secondary linear motor $A_3$ to produce a large thrust as by the linear motors $A_1$ and $A_2$ which serve to accelerate or decelerate the scanning stage 3. Consequently, the secondary linear motor $A_3$ can be made small in size and light in weight as compared with the linear motors $A_1$ and $A_2$.

Figure 3:
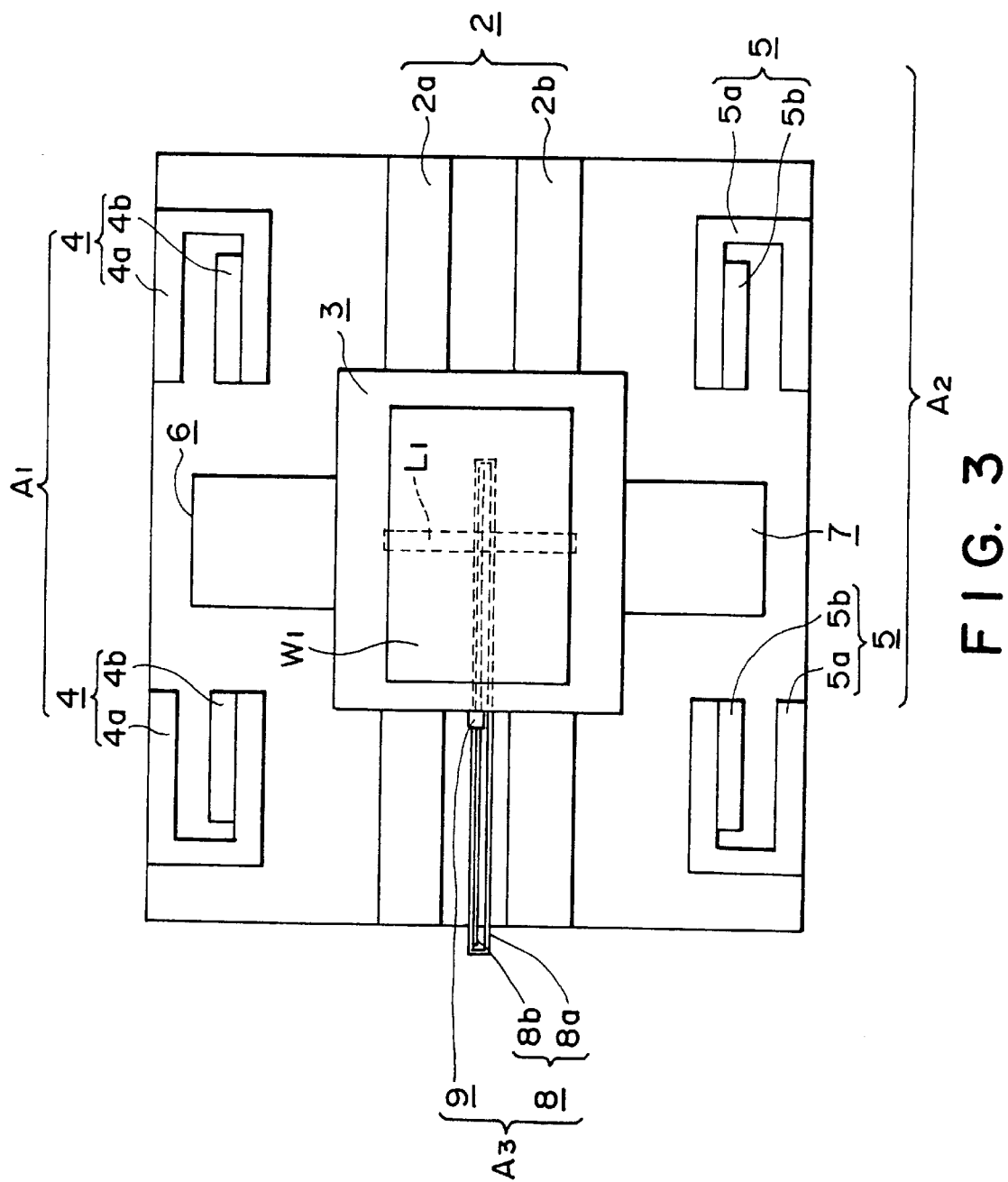
FIG. 3 is a top plan view of the stage device of FIG. 1.

Wafer $W_1$ is attracted to the scanning stage 3 through a wafer chuck mechanism (not shown). Above the wafer, a reticle (not shown) is held by a reticle stage (not shown). A slit-like region of the wafer $W_1$ is exposed with slit-like exposure light $L_1$ (as depicted by a broken line in FIG. 3), having been projected to a portion of the reticle, such that a portion of a pattern of the reticle is transferred to this portion of the wafer. By scanningly moving both the scanning stage 3 and the unshown reticle stage, the whole reticle pattern is transferred to the whole surface of the wafer $W_1$. The exposure of the wafer $W_1$ is performed during the period in which the scanning stage 3 moves through the central portion of its running path at a constant speed.

In this embodiment as described, linear motor stators of linear motor means for acceleration and deceleration of the scanning stage are provided only in the opposite end portions of the running path of the scanning stage. Therefore, it is not necessary to use a long magnet or yoke as in a case where a linear motor stator is provided along the entire length of the running path. Also, the thickness of the yoke sufficient for prevention of saturation of magnetic flux at the end portion, can be made small. Additionally, since what is required for the secondary linear motor is to prevent reduction in scanning speed of the scanning stage only, it is sufficient for the stator thereof to provide a magnetic flux of a few tens or hundreds gausses. Thus, the secondary linear motor as a whole can be made very small in size. This is very effective to reduce in size and weight the stage device as well as to reduce heat generation in the stage device. Even if a rare earth magnet which is expensive is used, the cost can be reduced considerably. Furthermore, there is an additional advantage that, when the scanning stage moves in the central portion of the running path, the scanning speed of the scanning stage can be controlled very precisely with the small-size secondary linear motor.

As an example, if the total amount of the magnetic fluxes by the linear motor stators of all the linear motors of this embodiment is about one half of the total amount of the magnetic fluxes of all the linear motors used in the FIG. 14 arrangement, the thickness of the yoke of the linear motor stator of this embodiment can be about one half of that of the FIG. 14 arrangement. Also, the necessary amount of the expensive magnet or yoke can be about one half of that of the FIG. 14 arrangement. Therefore, the present embodiment is very effective to reduce the size and weight of the stage device, to reduce the heat generation, and to reduce the cost of the stage device. This advantage is more significant in a stage device having a larger scanning region of a scanning stage.

Embodiment 2

Figure 4:
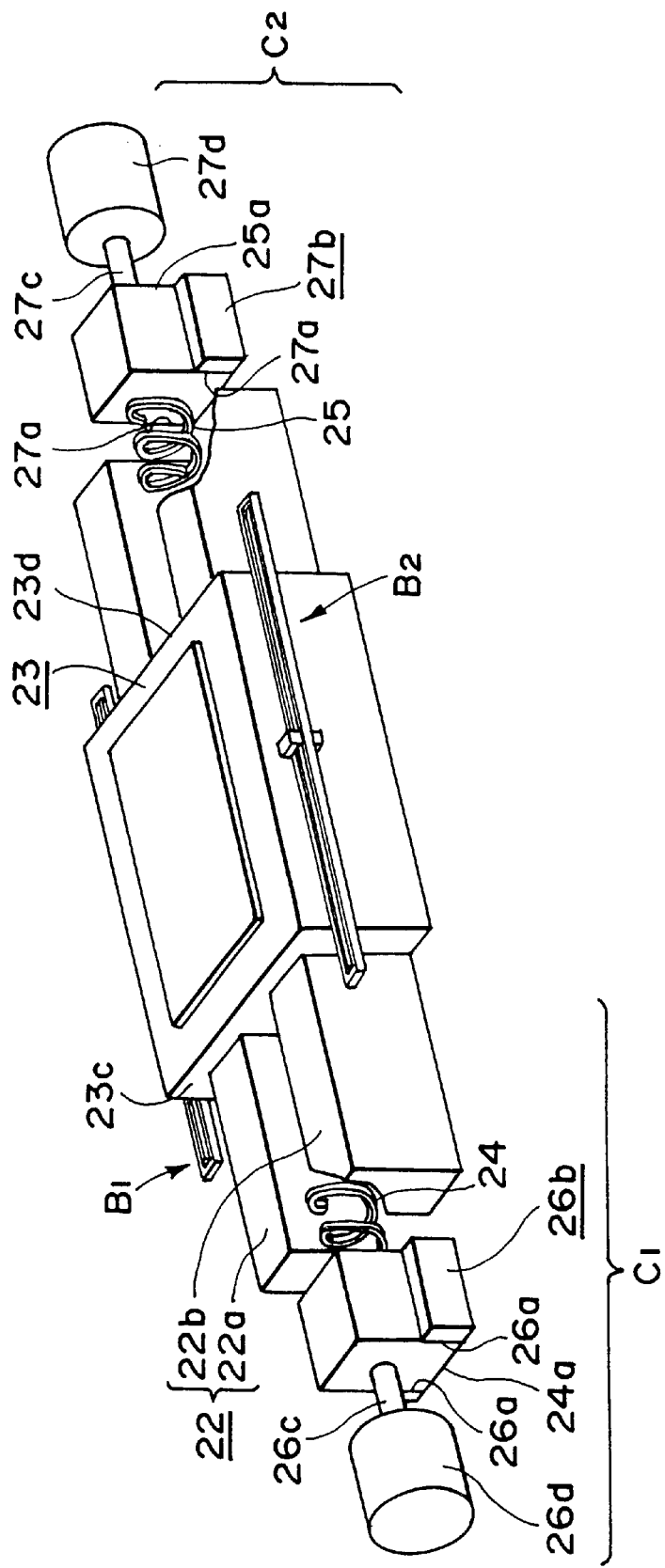
FIG. 4 is a perspective view of a scanning stage device according to a second embodiment of the present invention.

FIG. 4 is a perspective view of a scanning stage device according to a second embodiment of the present invention. Similarly in the scanning stage 3 of the first embodiment, a scanning stage 23 is reciprocally movable along a guide 22 which comprises a pair of guide rails 22a and 22b. Second thrust producing means similar to the secondary linear motor $A_3$ of the first embodiment, comprises small-size secondary linear motors $B_1$ and $B_2$ which are disposed at the opposite ends of the scanning stage 23. Acceleration and deceleration of the scanning stage 23 is provided by first thrust producing means which comprises a pair of thrust producing devices $C_1$ and $C_2$ having a pair of springs.

The thrust producing devices $C_1$ and $C_2$ comprise: coiled springs 24 and 25 having ends which are engageable with the opposite end faces 23c and 23d of the scanning stage 23, respectively; spring bases 24a and 25a for holding the other ends of the coiled springs 24 and 25, respectively; spring base guides 26b and 27b which have guide surfaces 26a and 26b for guiding the spring base 24a and 25a and which have clamps (not shown) disposed therein and being able to fixedly hold the spring bases 24a and 25a at desired positions, respectively, along the guide surfaces 26a and 27a, respectively; and motors 26d and 27d for rotating screws 26c and 27c to move the spring bases 24a and 25a along the guide surfaces 26a and 27a, respectively.

For rightward movement of the scanning stage as viewed in the drawing, for example, the scanning stage 23 is first clamped at its leftward end position of its running path by means of the unshown clamps. Then, the motors 26d and 27d are driven to displace the spring bases 24a and 25a toward and close to the scanning stage 23 by the same amounts, respectively, and the left-hand side coiled spring 24 is compressed between the scanning stage 23 and the spring base. After this, the spring bases 24a and 25a are clamped to the spring base guides 24b and 25b, respectively, and subsequently the clamping of the scanning stage 23 is released.

The scanning stage 23 moves rightwardly while being accelerated until the left-hand side coiled spring 24 expands back to its initial length and, after subsequent constant speed movement, the scanning stage engages with the right-hand side coiled spring 25. The scanning stage 23, while being decelerated thereby, reaches the rightward end of its running path.

For opposite rightward movement of the scanning stage 23, the right-hand side coiled spring is compressed and the returning force thereof is used.

In this embodiment, acceleration and deceleration of the scanning stage is provided by means of a thrust producing device having springs which are light in weight and low in cost as compared with a linear motor. Thus, reduction in weight, cost and heat generation of the stage device are enhanced.

Figure 5:
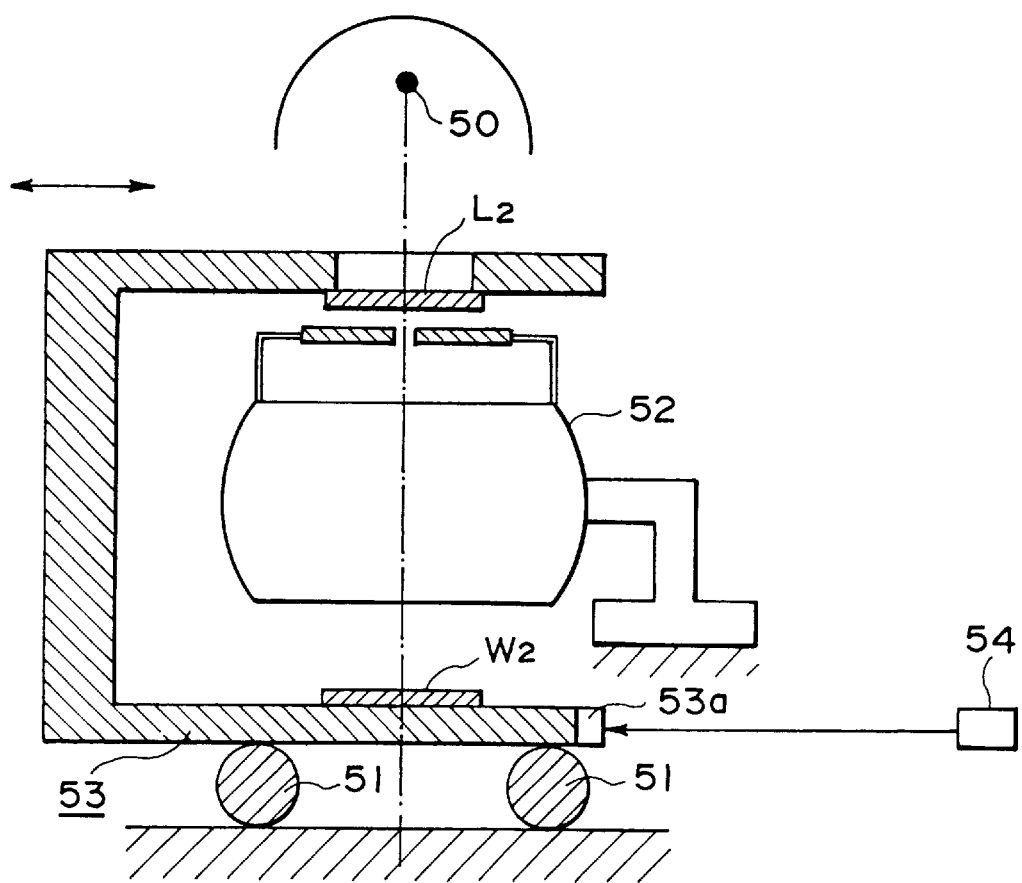
FIG. 5 is a schematic view of an embodiment of a scanning type exposure apparatus having a stage device according to one of the first and second embodiments of the present invention.

FIG. 5 is a schematic view of a model of a scanning type exposure apparatus which uses a scanning stage device according to the first or second embodiment described above. The exposure apparatus comprises an anti-vibration base 51, a scanning stage 53 supported by the anti-vibration base 51, and a unit-magnification imaging optical system 52 for imaging exposure light, being projected from a light source 50 and through a reticle $L_2$ supported by the scanning stage 53, upon a wafer $W_2$ similarly supported by the scanning stage 53. Similar to the scanning stages 3 and 23 of the scanning stage devices of the first and second embodiments, the scanning stage 53 comprises first and second thrust producing means (not shown) by which the scanning stage 53 can be reciprocally moved along a predetermined running path to thereby move the reticle $L_2$ and the wafer $W_2$ at the same speed. As they move through a central portion of the scanning path, the exposure process with the exposure light is performed. The scanning stage 53 is provided with a mirror 53a being integral therewith, and the position of the scanning stage 53 can be monitored by means of an interferometer 54 which receives light reflected by the mirror 53a.

FIG. 6 is a schematic view of another model of a scanning type exposure apparatus, in which a wafer $W_3$ is held by a wafer stage 61 supported by a first anti-vibration base 61a while a reticle $R_3$ is held by a reticle stage 63 supported by a second anti-vibration base 62a, such that the wafer stage 61 and the reticle stage 63 can be driven separately. The wafer stage 61 and the reticle stage 63 each includes first and second thrust producing means (not shown). A reduction imaging lens system 62 (exposure means) is disposed between the reticle stage and the wafer stage. Exposure light emitted by a light source 64 first passes through the reticle $R_3$ and, after being reduced by the reduction imaging lens system 62 at a predetermined reduction magnification N, it is projected on the wafer $W_3$. Similar to the FIG. 5 apparatus, the exposure of the wafer $W_3$ is performed as the wafer stage 61 and the reticle stage 62 move through the central portions of their running paths, respectively. Here, the scanning speed $V_1$ of the reticle stage 62 and the scanning speed $V_2$ of the wafer stage 61 are controlled to satisfy the following relation:

$V_2/V_1=N$.

Embodiment 3

Figure 7:
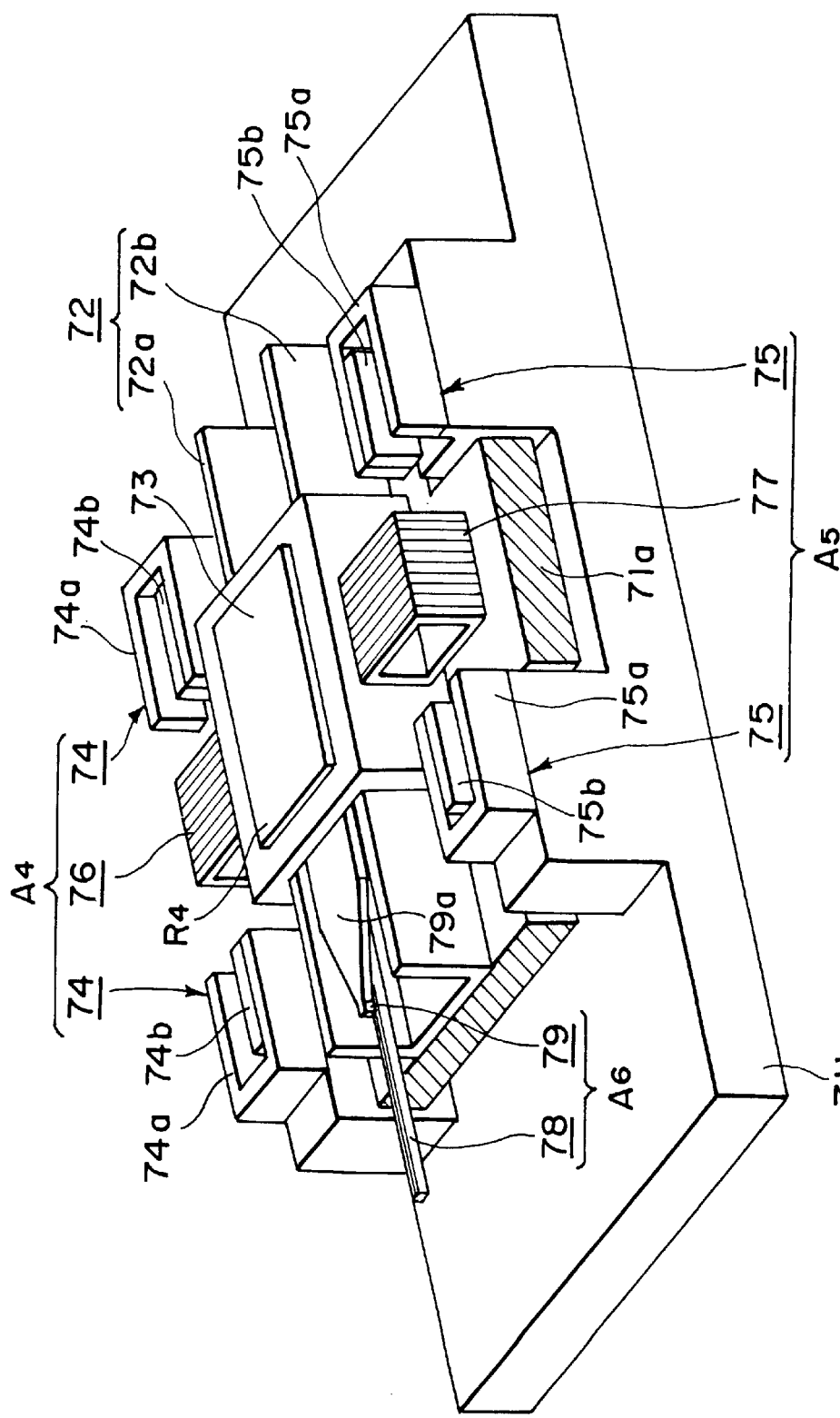
FIG. 7 is a perspective view of a scanning stage device according to a third embodiment of the present invention.

FIG. 7 is a perspective view of a scanning stage device according to a third embodiment of the present invention. The stage device comprises a reticle stage base 71a (scanning stage supporting means), a guide 72 having a pair of guide rails 72a and 72b fixed to the reticle stage base 71a, a reticle stage 73 movable reciprocally in a predetermined direction along the guide 72, two pairs of linear motor stators 74 and 75 disposed along and at the opposite sides of the running path of the reticle stage 73, and linear motor movable elements 76 and 77 disposed on the opposite sides of the reticle stage 73 and provided integrally therewith.

Each pair of linear motor stators 74 (75) has a structure which may correspond to the structure that: a long linear motor stator such as illustrated in FIG. 14 is provided along the entire length of the running path of the scanning stage 73, and after this, the central portion thereof is removed such that the opposite end portions of the stator remain. The stators 74 (75) are disposed at those positions corresponding to the positions of the "remaining" stator end portions.

The linear motor stators 74 and 75 cooperate with the linear motor movable elements 76 and 77 being integral with the scanning stage 73, to provide linear motors $A_4$ and $A_5$ (first thrust producing means) which serve to produce a first thrust for accelerating or decelerating the scanning stage 73 in each of the opposite end portions (acceleration or deceleration region) of the running path.

The scanning stage 73 movement is guided by the guide 72 without contact thereto, through static pressure bearing pads (not shown), for example. As the scanning stage 73 moves in the end portion of the running path, portions of yokes 74a and 75a of the linear motor stators 74 and 75 as well as magnets 74b and 75b held thereby penetrate through openings 76a and 77a of the linear motor movable elements 76 and 77, respectively. As the linear motor movable elements 76 and 77 are energized by drive currents supplied thereto, they produce a first thrust for accelerating or decelerating the scanning stage 73.

The linear motor stators 74 and 75 of the linear motors $A_4$ and $A_5$ are supported by a linear motor base 71b (thrust producing means supporting means) which is separate from and independent of the reticle stage base 71a. This effectively prevents vibration of the wafer stage 93 (see FIG. 11) of the exposure apparatus due to any reactive force of the drive force (thrust) of the linear motors $A_4$ and $A_5$.

Figure 8:
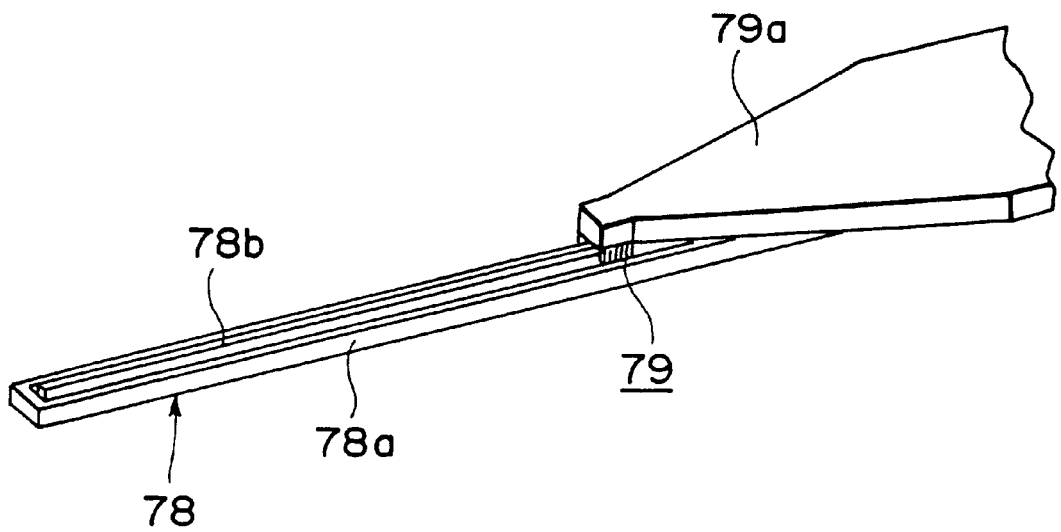
FIG. 8 is a fragmentary perspective view of a secondary linear motor of the stage device of FIG. 7.

Disposed between the guide rails 72a and 72b of the guide 72 is a secondary linear motor stator 78 which comprises, as shown in an enlarged view of FIG. 8, a small loop-like secondary yoke 78a and a secondary magnet 78b fixed to the inside of the secondary yoke 78a. Also, there is a secondary linear motor movable element 79 which cooperates with the secondary linear motor stator 78 to provide a secondary linear motor $A_6$ (second thrust producing means). The secondary linear motor stator 78 is fixed to the reticle stage base 71a, and the secondary linear motor movable element 79 is fixed to a supporting member 79a which protrudes from the bottom face of the reticle stage 73.

The secondary linear motor $A_6$ is energized mainly after the reticle stage 73 is accelerated up to a predetermined speed by means of the linear motor $A_4$ or $A_5$, and it serves to produce a second thrust effective to compensate for a change in the scanning speed of the reticle stage 73. Thus, the secondary linear motor $A_6$ serves to produce a thrust only in a period in which the reticle stage 73 runs through the central portion (constant speed scanning region) of the running path, to thereby maintain the scanning speed of the reticle stage 3 constant. Therefore, it is not necessary for the secondary linear motor $A_6$ to produce a large thrust as by the linear motor $A_4$ or $A_5$ which serves to accelerate or decelerate the reticle stage 73. Consequently, the secondary linear motor $A_6$ can be made small in size and light in weight as compared with the linear motors $A_4$ and $A_5$.

In this embodiment as described, the linear motor stators 74 and 75 of the linear motors $A_4$ and $A_5$ for acceleration and deceleration of the reticle stage 73 are provided only in the opposite end portions of the running path of the reticle stage 73. Therefore, it is not necessary to use a long magnet or yoke as in a case where the linear motor stators 74 and 75 are provided along the entire length of the running path. Also, the thickness of the yoke sufficient for prevention of saturation of the magnetic flux at the end portion, can be made small. This is very effective to reduce in size and weight the stage device as well as to reduce heat generation in the stage device. Even if a rare earth magnet which is expensive is used, the cost can be reduced considerably. Furthermore, there is an additional advantage that, when the reticle stage 73 moves in the central portion of the running path, the scanning speed of the reticle stage 73 can be controlled very precisely with the secondary linear motor $A_6$.

In a case when the external disturbance to the reticle stage is small, since the necessary drive amount of the secondary linear motor $A_6$ is relatively small, the secondary linear motor stator 78 may be fixed to any one of the reticle stage base 71a and the linear motor base 71b. If the external disturbance to the reticle stage is large, the linear motor stator may preferably be fixed to the linear motor base. This effectively prevents transmission, to the reticle stage, of any reactive force of the force of the secondary linear motor that acts against the external disturbance.

Generally, it is difficult to assure exact registration between the position where the thrust of the linear motors $A_4$ and $A_5$ act on the reticle stage 73 and the gravity center position of the reticle stage 73, with respect to the vertical direction. Usually, there is a small deviation between these positions. Thus, as the linear motors $A_4$ and $A_5$ operate, the drive force of them may cause a moment for rotating the reticle stage 73. This moment may cause a swinging motion of the reticle stage base 71a and, as a result of it, the exposure apparatus as a whole may swingingly vibrate or the frame 94 (see FIG. 11) may be deformed.

Figure 9:
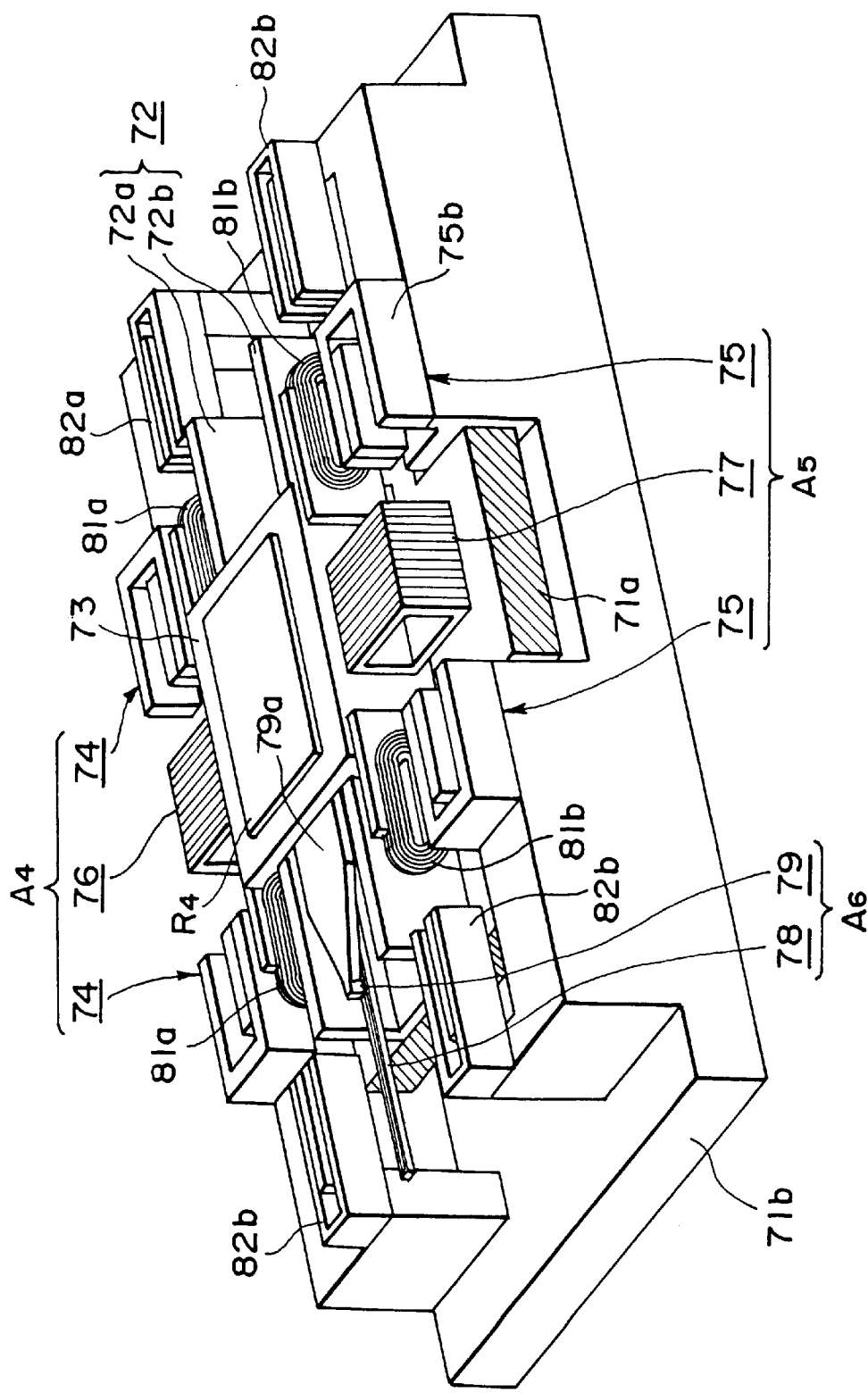
FIG. 9 is a perspective view of a modified form of the scanning stage device of the third embodiment of the present invention.

In order to avoid such a problem, a fluctuation preventing device (third thrust producing means) such as illustrated in FIG. 9 may preferably be added. This fluctuation preventing device comprises two pairs of flattened or elliptical coils 81a and 81b integrally provided with and disposed at the right-hand and left-hand sides of the guide rails of the guide 72, respectively, as well as two, right-hand side and left-hand side pairs of fluctuation preventing magnet units 82a and 82b being supported by the linear motor base 71b.

Figure 10:
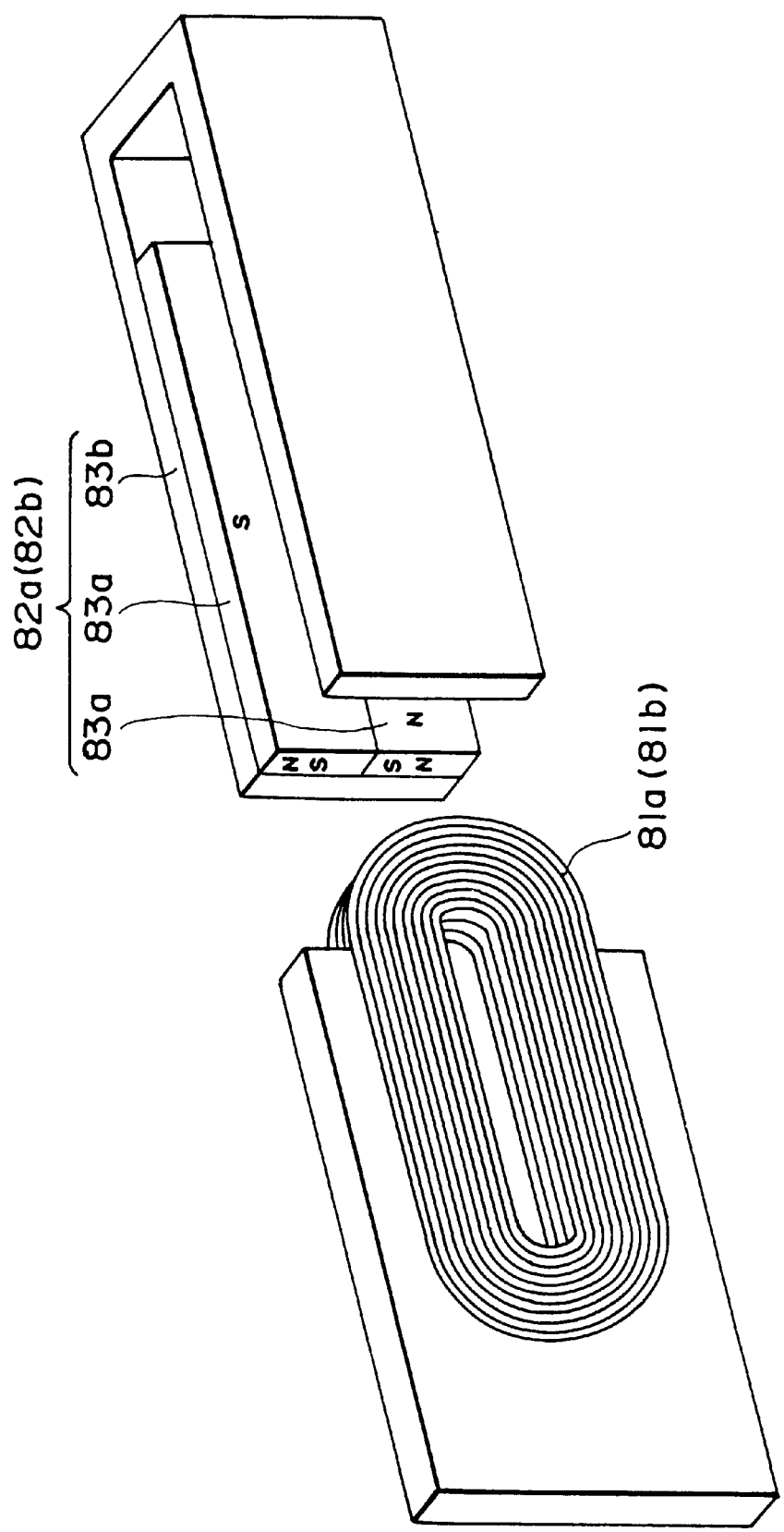
FIG. 10 is a schematic view for explaining an elliptic coil and a fluctuation preventing magnet unit of the stage device of FIG. 9.

As illustrated in an enlarged view of FIG. 10, each of the coils 81a and 81b comprises a vertical type coil being held vertically. Each of the fluctuation preventing magnet units 82a or 82b comprises two magnets 83a having different properties and a yoke 83b for holding these magnets in an accumulated position with respect to the vertical direction. During operation of the linear motors $A_4$ and $A_5$, the right-hand or left-hand coils 81a and 81b are in the position penetrating into the opening of the fluctuation preventing magnet units 82a and 82b. By electric currents supplied to the coils 81a and 81b, a third thrust in the vertical direction is produced such that the moment resulting from this thrust serves to cancel the rotational moment produced in the reticle stage base 71a by the drive forces of the linear motors $A_4$ and $A_5$.

The control of the electric currents to be supplied to the coils 81a and 81b may be performed by measuring the acceleration of the reticle stage 73 and by feeding back the amount of fluctuation of the reticle stage 73, for example, as calculated on the basis of the measurement. Alternatively, an electric current pattern having been programmed beforehand in the timed relation with the currents to be supplied to the linear motors $A_4$ and $A_5$, may be used.

Figure 11:
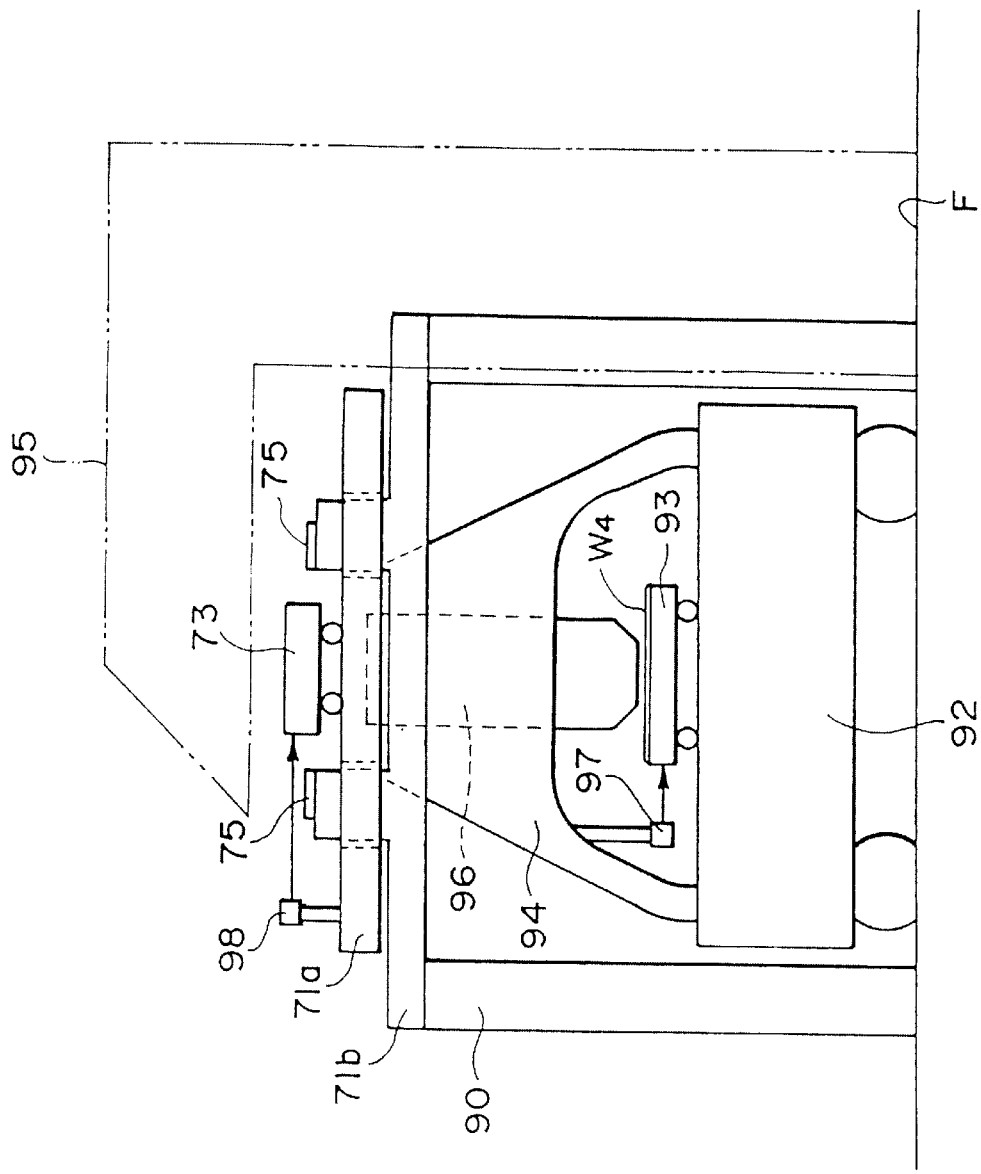
FIG. 11 is an elevational view, showing an exposure apparatus as a whole, having a stage device according to the third embodiment of the present invention.

FIG. 11 shows an exposure apparatus as a whole, in which a reticle stage 73 according to the third embodiment is incorporated. As described hereinbefore, the reticle stage base 71a for supporting the reticle stage 73 is made integral with a frame 94 which is mounted on a base table 92 for supporting a wafer stage 93 of the exposure apparatus. On the other hand, the linear motor base 71b is supported by a supporting frame 90 which is directly fixed to the floor F, separately from the base table 92. The exposure light for exposing a wafer $W_4$ on the wafer stage 93 is produced by a light source device 95, as depicted by a broken line.

The frame 94 supports the reticle stage base 71a as well as a projection optical system 96 at a position between the reticle stage 73 and the wafer stage 93. Since the linear motor stators 74 and 75 of the linear motors $A_4$ and $A_5$ for acceleration and deceleration of the reticle stage 73, are supported by the supporting frame 90 which is separate from the frame 94 as described hereinbefore, there is no possibility that a reactive force of the drive force of the linear motors $A_4$ and $A_5$ of the reticle stage 73 is transmitted to the wafer stage 93 to cause external disturbance to its driving means or that it produces vibration of the projection optical system 96.

By avoiding the problem due to the reactive force of the drive force of the linear motors $A_4$ and $A_5$ of the reticle stage 73 in the manner described, it is possible to reduce the wait time for a start of the subsequent exposure cycle and thereby to improve the throughput of the exposure apparatus.

The wafer stage 93 is scanningly moved by driving means (not shown) similar to that of the reticle stage 73, in a timed relation with the reticle stage 73. During the scan of their reticle stage 73 and the wafer stage 93, the positions are uninterruptedly detected by means of interferometers 97 and 98, and the detected positions are fed back to the driving means of the reticle stage 73 and the wafer stage 93, respectively. Thus, it is assured to synchronize the scanning start positions of these stages exactly and also to control the scanning speed in the constant-speed scan region very precisely.

When a fluctuation preventing device such as described hereinbefore is added to the reticle stage 73, it is possible to cancel the rotational moment attributable to the drive force of the linear motors $A_4$ and $A_5$ of the reticle stage 73 to thereby prevent fluctuation of the exposure apparatus as a whole during acceleration or deceleration of the reticle stage 73. Thus, it is possible to avoid large swinging vibration of the exposure apparatus and resultant deformation of the frame 94 which causes deviation in relative position of the interferometer 97 or 98 relative to the reticle stage 73 or the wafer stage 93.

Embodiment 4

Now, an embodiment of a device manufacturing method which uses an exposure apparatus such as described above, will be explained.

Figure 12:
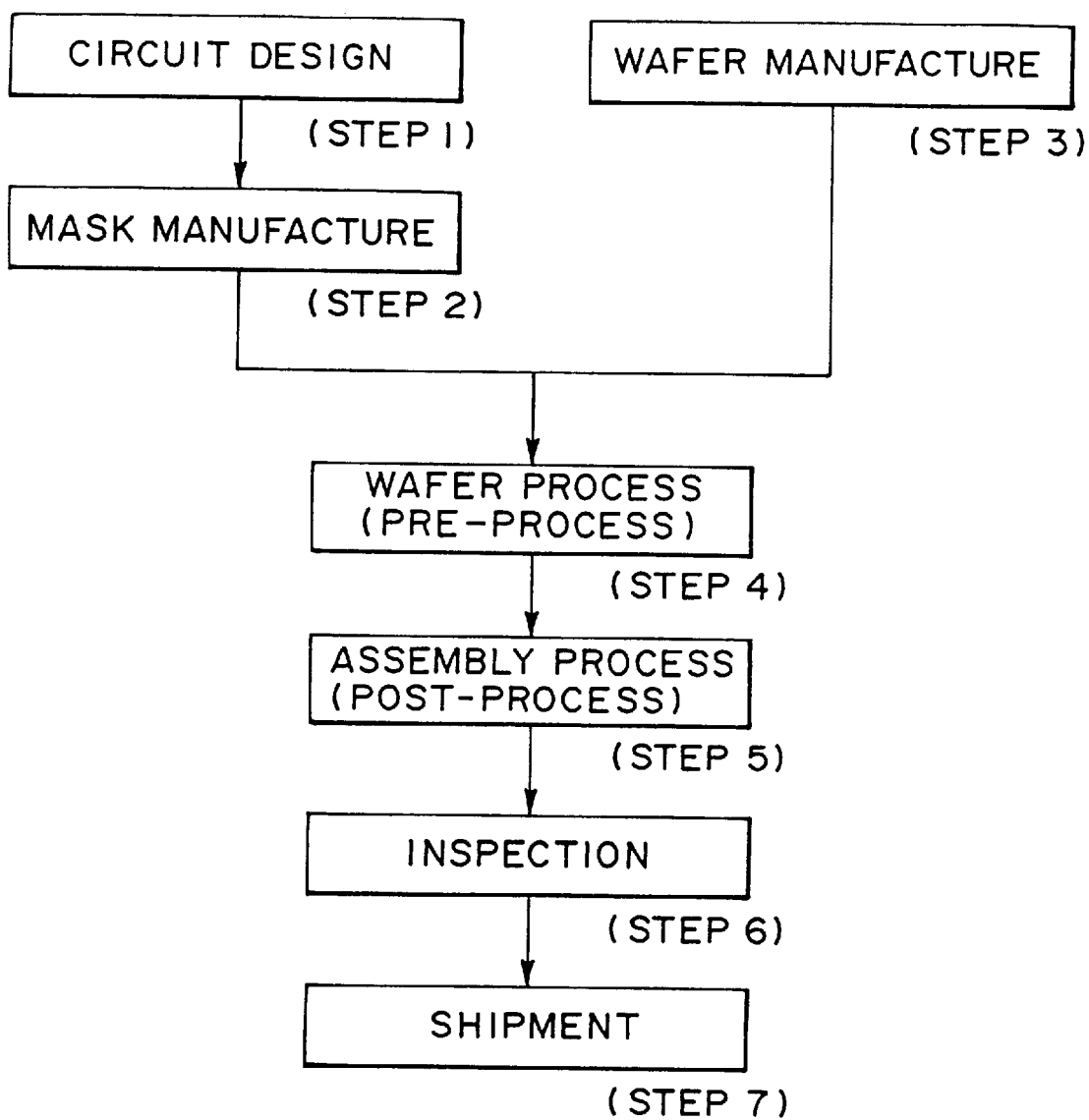
FIG. 12 is a flow chart-of microdevice manufacturing processes for manufacturing microdevices such as semiconductor devices, for example.

FIG. 12 is a flow chart of the sequence of manufacturing a semiconductor device such as a semiconductor chip (e.g., IC or LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein operability check, durability check and so on of the semiconductor devices produced by step 5 are carried out. With these processes, semiconductor devices are finished and they are shipped (step 7).

Figure 13:
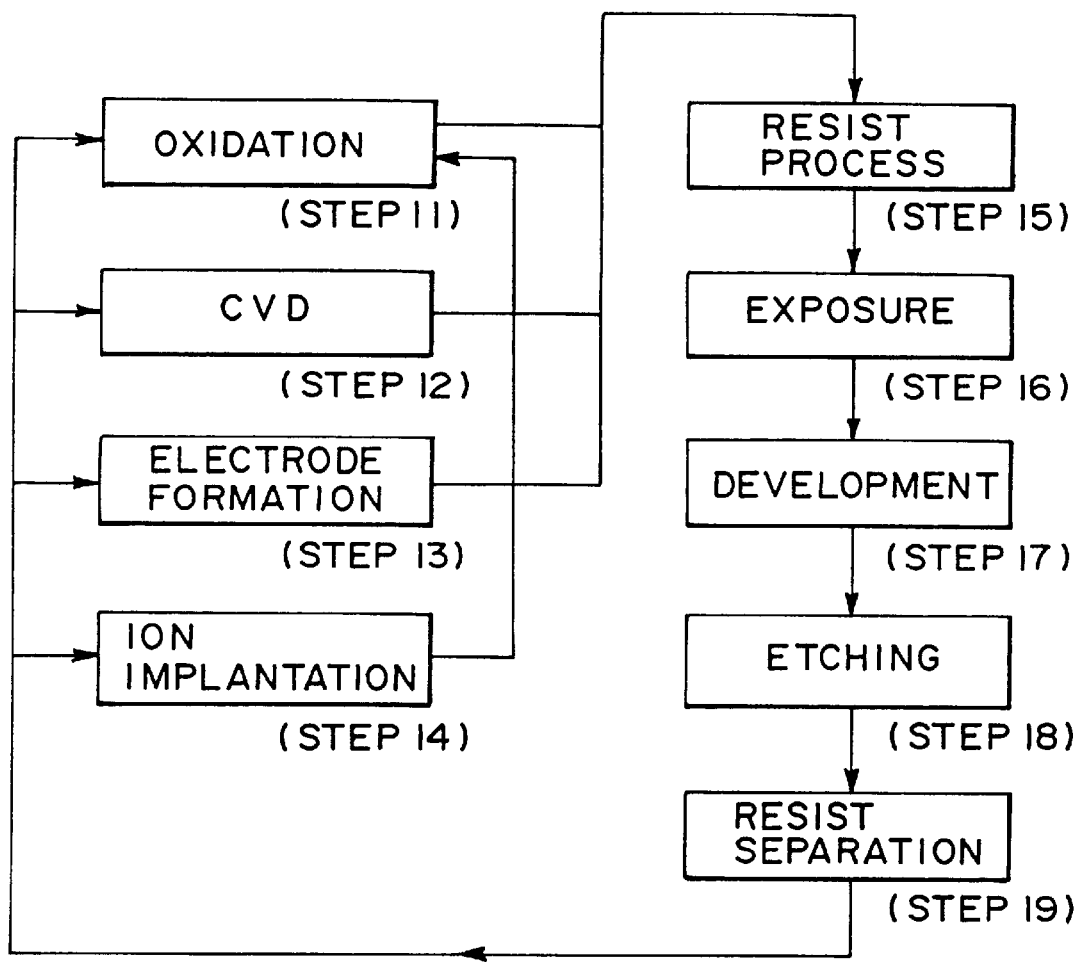
FIG. 13 is a flow chart of a wafer process.

FIG. 13 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A scanning exposure apparatus comprising:
   a projection optical system for projecting a pattern of a reticle onto a wafer;
   a reticle stage for holding and scanningly moving the reticle relative to said projection optical system;
   a reticle stage actuator for moving said reticle stage; and
   a reticle interferometer for detecting positional information related to said reticle stage, said reticle interferometer being kept separate from said reticle stage actuator with respect to vibration transmission.

2. An apparatus according to claim 1, further comprising a wafer interferometer for detecting positional information related to a wafer stage, which holds the wafer.

3. An apparatus according to claim 2, wherein said reticle interferometer and said wafer interferometer are substantially fixed to said projection optical system.

4. An apparatus according to claim 1, further comprising a reticle stage base for supporting said reticle stage and being independent from at least said reticle stage actuator.

5. An apparatus according to claim 1, wherein said projection optical system is independent from at least said reticle stage actuator.

6. An apparatus according to claim 5, wherein said reticle interferometer is substantially fixed to said projection optical system.

7. An apparatus according to claim 5, further comprising a reticle stage base for supporting said reticle stage and being fixed to said projection optical system.

8. An apparatus according to claim 1, wherein said reticle stage actuator comprises a linear motor.

9. An apparatus according to claim 8, wherein said linear motor has a stator being independent from at least said reticle interferometer.

10. An apparatus according to claim 1, wherein said reticle stage actuator comprises a spring.

11. An apparatus according to claim 1, wherein said reticle stage actuator comprises first and second actuators.

12. An apparatus according to claim 11, wherein said first actuator accelerates said reticle stage, and said second actuator moves said reticle stage to maintain a constant speed.

13. An apparatus according to claim 11, wherein said first actuator comprises linear motor.

14. An apparatus according to claim 11, wherein said second actuator comprises a single-phase linear motor.

15. An apparatus according to claim 11, wherein said second actuator has a positioning precsion higher than that of said first actuator.

16. An apparatus according to claim 11, wherein said projection optical system is independent from at least said first and second actuators.

17. An apparatus according to claim 11, further comprising a third actuator for producing a thrust in a vertical direction perpendicular to a scan direction.

18. An apparatus according to claim 11, further comprising a third actuator for canceling a moment produced by said first actuator.

19. An apparatus according to claim 1, further comprising an actuator base for supporting said reticle stage actuator and being fixed to a floor.

20. An apparatus according to claim 1, further comprising a light source disposed on a floor, for providing exposure light to the reticle.

21. A scanning exposure apparatus comprising:
   a projection optical system for projecting a pattern of a reticle onto a wafer;
   a reticle stage for holding and scanningly moving the reticle relative to said projection optical system;
   a reticle stage actuator for moving said reticle stage; and
   a reticle interferometer for detecting positional information related to said reticle stage, said reticle interferometer being disposed independently from said reticle stage actuator with respect to vibration transmission.

22. An apparatus according to claim 21, further comprising a wafer interferometer for detecting positional information related to a wafer stage, which holds the wafer.

23. An apparatus according to claim 22, wherein said reticle interferometer and said wafer interferometer are substantially fixed to said projection optical system.

24. An apparatus according to claim 21, further comprising a reticle stage base for supporting said reticle stage and being independent from at least said reticle stage actuator.

25. An apparatus according to claim 21, wherein said projection optical system is independent from at least said reticle stage actuator.

26. An apparatus according to claim 25, wherein said reticle interferometer is substantially fixed to said projection optical system.

27. An apparatus according to claim 25, further comprising a reticle stage base for supporting said reticle stage and being fixed to said projection optical system.

28. An apparatus according to claim 21, wherein said reticle stage actuator comprises a linear motor.

29. An apparatus according to claim 28, wherein said linear motor has a stator being independent from at least said reticle interferometer.

30. An apparatus according to claim 21, wherein said reticle stage actuator comprises a spring.

31. An apparatus according to claim 21, wherein said reticle stage actuator comprises first and second actuators.

32. An apparatus according to claim 31, wherein said first actuator accelerates said reticle stage, and said second actuator moves said reticle stage to maintain a constant speed.

33. An apparatus according to claim 31, wherein said first actuator comprises a linear motor.

34. An apparatus according to claim 31, wherein said second actuator comprises a single-phase linear motor.

35. An apparatus according to claim 31, wherein said second actuator has a positioning precision higher than that of said first actuator.

36. An apparatus according to claim 31, wherein said projection optical system is independent from at least said first and second actuators.

37. An apparatus according to claim 31, further comprising a third actuator for producing a thrust in a vertical direction perpendicular to a scan direction.

38. An apparatus according to claim 31, further comprising a third actuator for canceling a moment produced by said first actuator.

39. An apparatus according to claim 21, further comprising an actuator base for supporting said reticle stage actuator and being fixed to a floor.

40. An apparatus according to claim 21, further comprising a light source disposed on a floor, for providing exposure light to the reticle.

41. A scanning exposure apparatus comprising:
a projection optical system for projecting a pattern of a reticle onto a wafer;
a reticle stage for holding the reticle and scanningly moving the reticle relative to said projection optical system;
a first actuator for moving said reticle stage; and
a second actuator for moving said reticle stage,
wherein said projection optical system is kept separate from at least one of said first and second actuators with respect to vibration transmission.

42. An apparatus according to claim 41, further comprising a reticle interferometer for measuring a position of said reticle stage and a wafer interferometer for measuring a position of a wafer stage, which holds the wafer.

43. An apparatus according to claim 42, wherein said reticle interferometer and said wafer interferometer are independent from said projection optical system.

44. An apparatus according to claim 42, wherein said reticle stage base is independent from said reticle interferometer.

45. An apparatus according to claim 41, wherein said first actuator accelerates said reticle stage, and said second actuator moves said reticle stage to maintain a constant speed.

46. An apparatus according to claim 41, wherein said first actuator comprises a linear motor.

47. An apparatus according to claim 41, wherein said second actuator comprises a single-phase linear motor.

48. An apparatus according to claim 41, wherein said second actuator has a positioning precision higher than that of said first actuator.

49. An apparatus according to claim 41, wherein said projection optical system is independent from at least said first and second actuators.

50. An apparatus according to claim 41, further comprising a third actuator for producing a thrust in a vertical direction perpendicular to a scan direction.

51. An apparatus according to claim 41, further comprising a third actuator for canceling a moment produced by said first actuator.

52. An apparatus according to claim 41, further comprising an actuator base for supporting said reticle stage actuator and being fixed to a floor.

53. An apparatus according to claim 41, further comprising a light source disposed on a floor, for providing exposure light to the reticle.

54. A scanning exposure apparatus comprising:
a projection optical system for projecting a pattern of a reticle onto a wafer;
a reticle stage for holding the reticle and scanningly moving the reticle relative to said projection optical system;
a first actuator for moving said reticle stage; and
a second actuator for moving said reticle stage,
wherein said projection optical system is disposed independently from at least one of said first and second actuators with respect to vibration transmission.

55. An apparatus according to claim 54, further comprising a reticle interferometer for measuring a position of said reticle stage and a wafer interferometer for measuring a position of a wafer stage, which holds the wafer.

56. An apparatus according to claim 55, wherein said reticle interferometer and said wafer interferometer are independent from said projection optical system.

57. An apparatus according to claim 55, wherein said reticle stage base is independent from said reticle interferometer.

58. An apparatus according to claim 54, wherein said first actuator accelerates said reticle stage, and said second actuator moves said reticle stage to maintain a constant speed.

59. An apparatus according to claim 54, wherein said first actuator comprises a linear motor.

60. An apparatus according to claim 54, wherein said second actuator comprises a single-phase linear motor.

61. An apparatus according to claim 54, wherein said second actuator has a positioning precision higher than that of said first actuator.

62. An apparatus according to claim 54, wherein said projection optical system is independent from at least said first and second actuators.

63. An apparatus according to claim 54, further comprising a third actuator for producing a thrust in a vertical direction perpendicular to a scan direction.

64. An apparatus according to claim 54, further comprising a third actuator for canceling a moment produced by said first actuator.

65. An apparatus according to claim 54, further comprising an actuator base for supporting said reticle stage actuator and being fixed to a floor.

66. An apparatus according to claim 54, further comprising a light source disposed on a floor, for providing exposure light to the reticle.

67. A scanning exposure apparatus comprising:
a projection optical system for projecting a pattern of a reticle onto a wafer;
a wafer stage for holding the wafer and scanningly moving the wafer relative to said projection optical system;
a reticle stage for holding the reticle and scanningly moving the reticle relative to said projection optical system;
a reticle stage actuator for moving said reticle stage;
a wafer interferometer for detecting positional information related to said wafer stage; and
a reticle interferometer for detecting positional information related to said reticle stage,
wherein said wafer interferometer and said reticle interferometer are fixed to said projection optical system, and said projection optical system is kept separate from said reticle stage actuator with respect to vibration transmission.

68. An apparatus according to claim 67, further comprising a reticle stage base for supporting said reticle stage and being isolated from said reticle stage actuator.

69. An actuator according to claim 67, further comprising a wafer stage base for supporting said wafer stage and being isolated from said reticle stage actuator.

70. An apparatus according to claim 67, further comprising a reticle stage base for supporting said reticle stage, and a wafer stage base for supporting said wafer stage, wherein said reticle stage base and said wafer stage base are fixed to each other.

71. An apparatus according to claim 67, further comprising a reticle stage base for supporting said reticle stage and being fixed to said projection optical system.

72. An apparatus according to claim 67, wherein said reticle stage actuator comprises a linear motor.

73. An apparatus according to claim 72, wherein said linear motor has a stator being independent from at least said reticle interferometer.

74. An apparatus according to claim 67, wherein said reticle stage actuator comprises a spring.

75. An apparatus according to claim 67, wherein said reticle stage actuator comprises first and second actuators.

76. An apparatus according to claim 75, wherein said first actuator accelerates said reticle stage, and said second actuator moves said reticle stage to maintain a constant speed.

77. An apparatus according to claim 75, wherein said first actuator comprises a linear motor.

78. An apparatus according to claim 75, wherein said second actuator comprises a single-phase linear motor.

79. An apparatus according to claim 75, wherein said second actuator has a positioning precision higher than that of said first actuator.

80. An apparatus according to claim 75, wherein said projection optical system is independent from at least said first and second actuators.

81. An apparatus according to claim 75, further comprising a third actuator for producing a thrust in a vertical direction perpendicular to a scan direction.

82. An apparatus according to claim 75, further comprising a third actuator for canceling a moment produced by said first actuator.

83. An apparatus according to claim 67, further comprising an actuator base for supporting said reticle stage actuator and being fixed to a floor.

84. An apparatus according to claim 67, further comprising a light source disposed on a floor, for providing exposure light to the reticle.

85. A scanning exposure apparatus comprising:
a projection optical system for projecting a pattern of a reticle onto a wafer;
a wafer stage for holding the wafer and scanningly moving the wafer relative to said projection optical system;
a reticle stage for holding the reticle and scanningly moving the reticle relative to said projection optical system;
a reticle stage actuator for moving said reticle stage;
a wafer interferometer for detecting positional information related to said wafer stage; and
a reticle interferometer for detecting positional information related to said reticle stage,
wherein said wafer interferometer and said reticle interferometer are fixed to said projection optical system, and said projection optical system is disposed independently from said reticle stage actuator with respect to vibration transmission.

86. An apparatus according to claim 85, further comprising a reticle stage base for supporting said reticle stage and being isolated from said reticle stage actuator.

87. An actuator according to claim 85, further comprising a wafer stage base for supporting said wafer stage and being isolated from said reticle stage actuator.

88. An apparatus according to claim 85, further comprising a reticle stage base for supporting said reticle stage, and a wafer stage base for supporting said wafer stage, wherein said reticle stage base and said wafer stage base are fixed to each other.

89. An apparatus according to claim 85, further comprising a reticle stage base for supporting said reticle stage and being fixed to said projection optical system.

90. An apparatus according to claim 85, wherein said reticle stage actuator comprises a linear motor.

91. An apparatus according to claim 90, wherein said linear motor has a stator being independent from at least said reticle interferometer.

92. An apparatus according to claim 85, wherein said reticle stage actuator comprises a spring.

93. An apparatus according to claim 85, wherein said reticle stage actuator comprises first and second actuators.

94. An apparatus according to claim 93, wherein said first actuator accelerates said reticle stage, and said second actuator moves said reticle stage to maintain a constant speed.

95. An apparatus according to claim 93, wherein said first actuator comprises a linear motor.

96. An apparatus according to claim 93, wherein said second actuator comprises a single-phase linear motor.

97. An apparatus according to claim 93, wherein said second actuator has a positioning precision higher than that of said first actuator.

98. An apparatus according to claim 93, wherein said projection optical system is independent from at least said first and second actuators.

99. An apparatus according to claim 93, further comprising a third actuator for producing a thrust in a vertical direction perpendicular to a scan direction.

100. An apparatus according to claim 93, further comprising a third actuator for canceling a moment produced by said first actuator.

101. An apparatus according to claim 85, further comprising an actuator base for supporting said reticle stage actuator and being fixed to a floor.

102. An apparatus according to claim 85, further comprising a light source disposed on a floor, for providing exposure light to the reticle.

103. A scanning type exposure apparatus, comprising:

a reticle stage for moving a reticle in a scan direction;

a reticle stage base for supporting said reticle stage;

a first actuator for moving said reticle stage base in the scan direction;

a second actuator for applying, to said reticle stage base, a force in a direction perpendicular to the scan direction; and an actuator base for supporting said first and second actuators, said actuator base being separate and independent from said reticle stage base with respect to vibration transmission.

104. An apparatus according to claim 103, wherein said second actuator is effective to cancel a moment produced when said first actuator moves said reticle stage.

105. A device manufacturing method, comprising the steps of:

moving a reticle in a scan direction using a reticle stage;

supporting the reticle stage with a reticle stage base;

moving the reticle stage base in the scan direction using a first actuator;

applying, to the reticle stage base, a force in a direction perpendicular to the scan direction, using a second actuator;

supporting the first and second actuators using an actuator base, the actuator base being separate and independent from the reticle stage base with respect to vibration transmission;

applying a resist to a wafer;

exposing the wafer with a pattern of the reticle by exposure; and developing the exposed wafer.

106. A method according to claim 105, further comprising canceling, using the second actuator, a moment produced when the first actuator moves the reticle stage.

* * * * *

UNITED STATES PATENT AND TRADEMARK OFFICE
CERTIFICATE OF CORRECTION

PATENT NO. : 6,426,788 B1
DATED : July 30, 2002
INVENTOR(S) : Nobushige Korenaga It is certified that error appears in the above-identified patent and that said Letters Patent is hereby corrected as shown below:

<u>Title page,</u>
Item [30], Foreign Application Priority Data, "May 15, 1995" should be corrected to read -- May 8, 1995 --.

<u>Column 3,</u>
Line 21, "-linear" should read -- linear --.

<u>Column 4,</u>
Line 47, "chart-of" should read -- chart of --.

<u>Column 10,</u>
Line 52, "their" should read -- the --.
Line 53, the second occurrence of "the" should read -- their --.
Line 59, "scan" should read -- scanning --.

Signed and Sealed this

Eleventh Day of February, 2003

JAMES E. ROGAN
*Director of the United States Patent and Trademark Office*